United States Patent
Yonemochi et al.

(10) Patent No.: US 8,211,777 B2
(45) Date of Patent: Jul. 3, 2012

(54) METHOD OF MANUFACTURING NONVOLATILE SEMICONDUCTOR DEVICE

(75) Inventors: Yasuaki Yonemochi, Tokyo (JP); Hisakazu Otoi, Tokyo (JP); Akio Nishida, Tokyo (JP); Shigeru Shiratake, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/727,890

(22) Filed: Mar. 19, 2010

(65) Prior Publication Data

US 2010/0190330 A1 Jul. 29, 2010

Related U.S. Application Data

(62) Division of application No. 11/402,972, filed on Apr. 13, 2006, now Pat. No. 7,705,392.

(30) Foreign Application Priority Data

Apr. 15, 2005 (JP) ................................. 2005-118505

(51) Int. Cl.
*H01L 21/76* (2006.01)

(52) U.S. Cl. ........ 438/422; 438/411; 438/421; 438/593; 438/595; 257/E21.179; 257/E21.626; 257/E21.64

(58) Field of Classification Search .......... 257/314–316, 257/324, E29.129, E29.162, E29.165, E21.179, 257/E21.626, E21.64; 438/411, 421, 422, 438/593, 595

See application file for complete search history.

(56) References Cited

U.S. PATENT DOCUMENTS

| | | | |
|---|---|---|---|
| 5,960,311 A | 9/1999 | Singh et al. | |
| 6,100,579 A | 8/2000 | Sonoda et al. | |
| 6,469,339 B1 * | 10/2002 | Onakado et al. | 257/315 |
| 6,835,620 B1 * | 12/2004 | Lee | 438/257 |
| 2001/0051423 A1 * | 12/2001 | Kim et al. | 438/624 |
| 2003/0222302 A1 | 12/2003 | Saito et al. | |
| 2004/0012093 A1 | 1/2004 | Koubuchi et al. | |
| 2004/0232496 A1 * | 11/2004 | Chen et al. | 257/390 |

(Continued)

FOREIGN PATENT DOCUMENTS

JP 62-188375 8/1987

(Continued)

OTHER PUBLICATIONS

Japanese Notice of Grounds of Rejection, with English translation, issued in Japanese Patent Application No. 2005-118505, mailed Jun. 15, 2010.

(Continued)

*Primary Examiner* — Matthew E Warren

(74) *Attorney, Agent, or Firm* — McDermott Will & Emery LLP

(57) ABSTRACT

A semiconductor substrate having a main surface, first and second floating gates formed spaced apart from each other on the main surface of the semiconductor substrate, first and second control gates respectively located on the first and second floating gates, a first insulation film formed on the first control gate, a second insulation film formed on the second control gate to contact the first insulation film, and a gap portion formed at least between the first floating gate and the second floating gate by achieving contact between the first insulation film and the second insulation film are included. With this, a function of a nonvolatile semiconductor device can be ensured and a variation in a threshold voltage of a floating gate can be suppressed.

1 Claim, 9 Drawing Sheets

U.S. PATENT DOCUMENTS

2005/0045966 A1    3/2005    Yamashita et al.

FOREIGN PATENT DOCUMENTS

| JP | 03-148875 | 6/1991 |
| JP | 09-289209 | 11/1997 |
| JP | 10-12730 A | 1/1998 |
| JP | 10-270575 | 10/1998 |
| JP | 2000-100976 A | 4/2000 |
| JP | 2002-76299 A | 3/2002 |
| JP | 2003-197779 | 7/2003 |
| JP | 2003-332468 | 11/2003 |
| JP | 2004-349549 | 12/2004 |
| WO | WO 2004/107352 A2 | 12/2004 |

OTHER PUBLICATIONS

Japanese Office Action, with English translation, issued in Japanese Patent Application No. 2005-118505, mailed Jan. 25, 2011.

Japanese Notice of Grounds of Rejection, with English Translation, issued in Japanese Patent Application No. 2005-118505, mailed Oct. 26, 2010.

United States Office Action issued in U.S. Appl. No. 12/613,057, mailed Mar. 28, 2011.

United States Office Action Issued in U.S. Appl. No. 12/613,057, mailed Oct. 6, 2010.

United States Office Action, issued in U.S. Appl. No. 12/613,057, dated Oct. 12, 2011.

* cited by examiner

US 8,211,777 B2

METHOD OF MANUFACTURING NONVOLATILE SEMICONDUCTOR DEVICE

RELATED APPLICATIONS

This application is a Divisional of U.S. application Ser. No. 11/402,972, filed on Apr. 13, 2006, claiming priority of Japanese Patent Application No. 2005-118505, filed on Apr. 15, 2005, the entire contents of each of which are hereby incorporated by reference.

BACKGROUND OF THE INVENTION

1. Field of the Invention

The present invention relates to a nonvolatile semiconductor device having reduced capacitive coupling between floating gates and a method of manufacturing the same.

2. Description of the Background Art

A generally known nonvolatile semiconductor device allowing electrical writing and erasing includes a plurality of floating gate electrodes formed on a main surface of a semiconductor substrate and control gate electrodes formed on the floating gate electrodes. As a degree of integration of a semiconductor integrated circuit becomes higher in recent years, a dimension between floating gates becomes smaller and a large capacity is readily generated between adjacent floating gates. As a result, a problem due to so-called capacitive coupling occurs, that is, a threshold voltage during reading of the floating gate varies according to potentials of surrounding floating gates.

Therefore, a nonvolatile semiconductor device having suppressed capacitive coupling of adjacent floating gates has been conventionally proposed. Japanese Patent Laying-Open No. 2000-100976, for example, describes a nonvolatile semiconductor device having cavities formed between adjacent floating gates and between adjacent control gates, and a nonvolatile semiconductor device having insulation films having a relative permittivity lower than that of silicon oxide which are formed between adjacent floating gates and between adjacent control gates.

Steps for manufacturing the nonvolatile semiconductor device having cavities formed between floating gate electrodes and between control gate electrodes include a step of forming a plurality of control gate electrodes on a top surface of a semiconductor substrate and a step of depositing an insulation film by vapor phase epitaxy at a normal pressure.

In the step of depositing an insulation film, the insulation film deposited does not completely fill space between control gate electrodes and between control gates to form cavities.

Steps for manufacturing the nonvolatile semiconductor device having insulation films having a permittivity lower than that of a silicon oxide film which are formed between floating gate electrodes and between control gate electrodes include a step of forming a plurality of control gate electrodes on a semiconductor substrate, a step of forming floating gate electrodes, and a step of forming fluoridated polyimide (having a relative permittivity of 2.7) between the control gate electrodes and between the floating gate electrodes formed.

In addition, Japanese Patent Laying-Open No. 2002-076299 describes a semiconductor device including a semiconductor substrate having a surface, a groove formed on a main surface of the semiconductor substrate, a first insulation film embedded in the groove, two conductive layers formed spaced apart from each other on the first insulation film, an opening formed in the first insulation film to expose a portion of the surface of the semiconductor substrate located directly below a region between two conductive layers, a second insulation film formed to fill the opening and cover the two conductive layers, and a gap formed in the opening filled with the second insulation film.

In this nonvolatile semiconductor device, a capacity between two conductive layers is also reduced with the gap positioned between the two conductive layers.

SUMMARY OF THE INVENTION

In a nonvolatile semiconductor device having cavities formed between control gates and between floating gates, however, an insulation film tends to enter space between floating gates or between control gates in a step of forming cavities between floating gates and between control gates. In addition, a film formed on a side surface of the control gate or a side surface of the floating gate tends to have a large thickness. With this, suppression of capacitive coupling between adjacent floating gates becomes difficult and a threshold voltage of a selected floating gate varies. Furthermore, in a nonvolatile semiconductor device having low-permittivity films having a permittivity lower than that of a silicon oxide film which are formed between floating gates and between control gates, hydrogen or water may exude to a gate insulation film, which inhibits a function of the nonvolatile semiconductor device.

The present invention was made in view of problems described above. An object of the present invention is to provide a nonvolatile semiconductor device which can ensure a function of the nonvolatile semiconductor device and has a suppressed variation in a threshold voltage of a floating gate.

A nonvolatile semiconductor device according to the present invention includes a semiconductor substrate having a main surface, first and second floating gates formed spaced apart from each other on the main surface of the semiconductor substrate, first and second control gates respectively located on the first and second floating gates, a first insulation film formed on the first control gate, a second insulation film formed on the second control gate to contact the first insulation film, and a gap portion formed at least between the first floating gate and the second floating gate by achieving contact between the first insulation film and the second insulation film.

According to a nonvolatile semiconductor device and a method of manufacturing the same according to the present invention, a variation in a threshold voltage of a floating gate can be suppressed while ensuring a function of the nonvolatile semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of a nonvolatile semiconductor device according to the present invention will now be described using FIGS. 1 to 17.

First Embodiment

Figure 1:
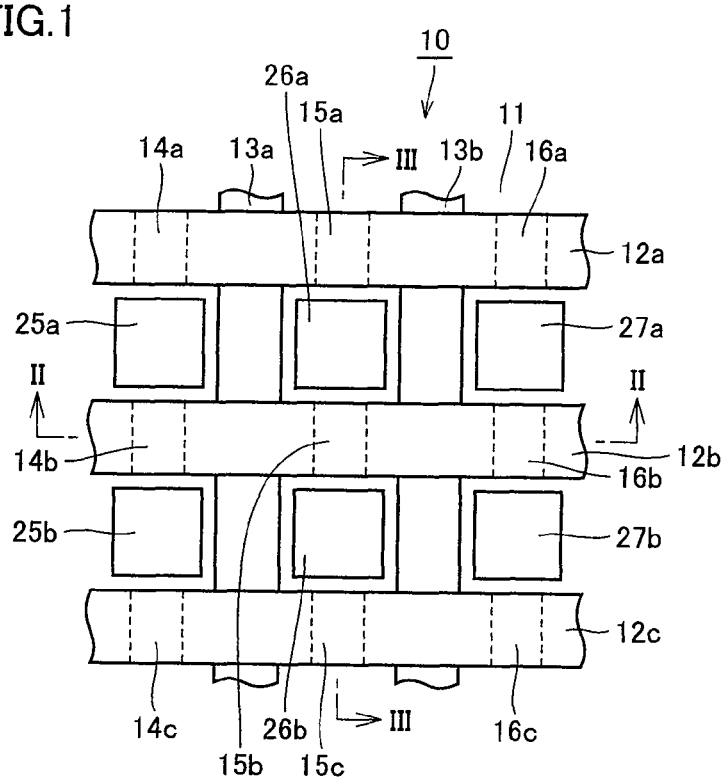
FIG. 1 is a plan view of a nonvolatile semiconductor device according to a first embodiment.

FIG. 1 is a plan view of a nonvolatile semiconductor device 10 according to a first embodiment. As shown in FIG. 1, a semiconductor substrate 11 having a main surface, assist gates 13a, 13b formed spaced apart from each other on the main surface of semiconductor substrate 11 and extending in one direction, floating gates (first floating gates) 14a-16a, 14c-16c formed on the main surface of semiconductor substrate 11, and floating gates (second floating gates) 14b-16b formed spaced apart from floating gates 14a-16a, 14c-16c are included.

Nonvolatile semiconductor device 10 also includes control gates (first control gates) 12a, 12c formed on floating gates 14a-16a, 14c-16c, and a control gate (second control gate) 12b formed on floating gates 14b-16b.

A plurality of floating gates 15a-15c are formed spaced apart from each other between assist gates 13a, 13b along an extending direction of assist gates 13a, 13b. In addition, gap portions 25a-27a, 25b-27b are formed between floating gates 14a-16a, 14b-16b, 14c-16c which are adjacent to each other in the extending direction of assist gates 13a, 13b.

Figure 2:
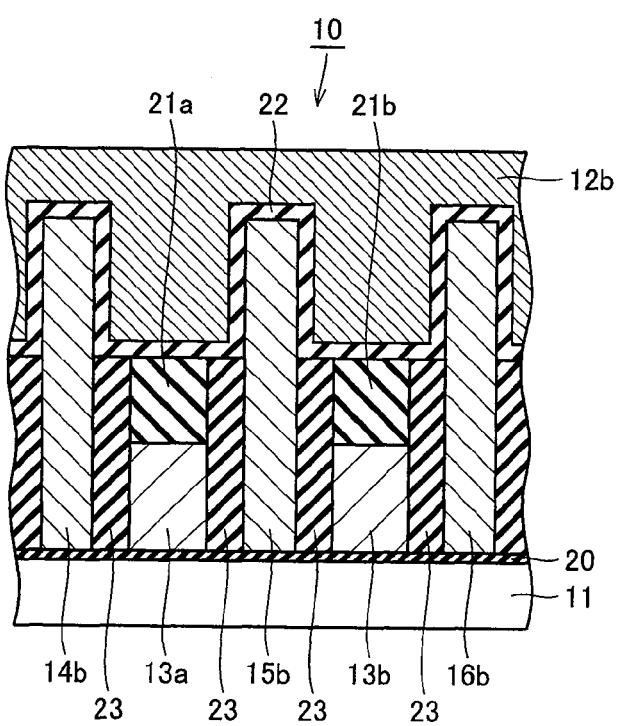
FIG. 2 is a cross-sectional view taken along the line II-II in FIG. 1.

FIG. 2 is a cross-sectional view taken along the line II-II in FIG. 1. As shown in FIG. 2, an insulation film 20 is formed on the main surface of semiconductor substrate 11, and assist gates 13a, 13b and floating gates 14b-16b are formed on the main surface of semiconductor substrate 11 via insulation film 20. Cap insulation films 21a, 21b are formed on respective top surfaces of assist gates 13a, 13b. An ONO (Oxide-Nitride-Oxide) film 22 is formed on a side of upper end portions of floating gates 14b-16b, and control gate 12b is formed via ONO film 22. ONO film 22 is formed by successively stacking silicon oxide, silicon nitride and silicon oxide, for example, from a lower side. Assist gates 13a, 13b are arranged between floating gates 14b-16b, and an insulation film 23 is formed between each of assist gates 13a, 13b and each of floating gates 14b-16b.

Figure 3:
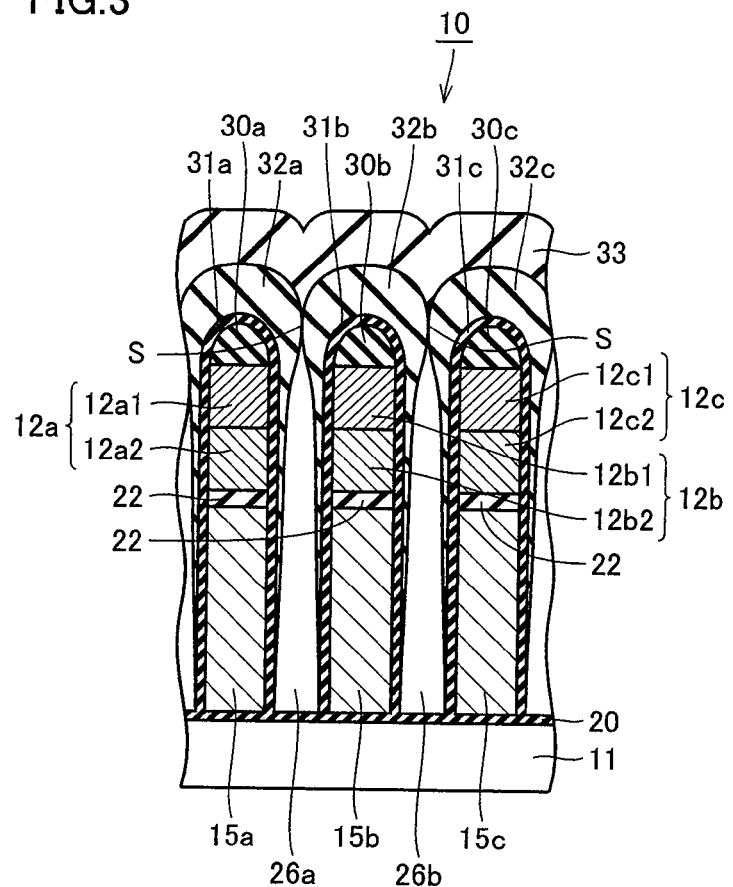
FIG. 3 is a cross-sectional view taken along the line III-III in FIG. 1.

FIG. 3 is a cross-sectional view taken along the line III-III in FIG. 1. As shown in FIG. 3, control gates 12a-12c are respectively constructed with conductor films 12a2-12c2 formed with polycrystalline silicon having a low resistance and metal silicide films 12a1-12c1 having a high melting point such as tungsten silicide ($WSi_x$) films which are formed on respective top surfaces of conductor films 12a2-12c2. A TEOS (Tetraethoxysilane) film is formed on an upper end surface of each of control gates 12a-12c. Then, insulation films 31a-31c are formed to cover surfaces of cap insulation films 30a-30c of the TEOS film, side surfaces of control gates 12a-12c, a side surface of ONO film 22, and side surfaces of floating gates 15a-15c.

In addition, insulation films (first insulation films) 32a, 32c are formed on respective control gates 12a, 12c via cap insulation films 30a, 30c and insulation films 31a, 31c. An insulation film (second insulation film) 32b is formed on control gate 12b via cap insulation film 30b and insulation film 31b.

Each of insulation films 32a, 32c is formed to have an upper portion gradually expanding in a lateral direction, and insulation film 32b is formed to contact insulation films 32a, 32c. Since insulation films 32a, 32c contact insulation film 32b, space between control gates 12a-12c and between floating gates 15a-15c is closed in a portion above control gates 12a-12c. Therefore, gap portions 26a, 26b are formed at least between floating gates 15a, 15c and floating gate 15b. Insulation films 32a-32c are formed to have thicknesses gradually decreasing from a side of upper end portions of control gates 12a-12c to a lower side. Insulation films 32a-32c are substantially not formed on a side of lower end portions of floating gates 15a-15c. Insulation films 32a-32c are also substantially not formed on a portion of the main surface of semiconductor substrate 11 located between floating gates 15a-15c.

Therefore, gap portions 26a, 26b are formed to have widths gradually increasing from a side of upper end portions of control gates 12a-12c to a lower side. In particular, gap portions 26a, 26b are formed to have large widths in portions between control gates 12a-12c and between floating gates 15a-15c.

A contact portion S between insulation films 32a-32c is located above control gates 12a-12c. Therefore, gap portions 26a, 26b are formed to extend from portions between floating gates 15a-15c to portions above upper end portions of control gates 12a-12c. It is to be noted that, each of insulation films 32a-32c may be formed with a porous insulation film having a permittivity lower than that of an silicon oxide film. A porous film such as silsesquioxane, porous silica, an aerogel thin film, or HSG (Hemi-Spherical Grain)-255 is suitable.

An insulation film 33 is formed on surfaces of such insulation films 32a-32c to cover contact portion S between insulation films 32a-32c. Insulation film 33 has high moisture resistance, and is formed with an insulation film made of a material different from that of insulation films 32a-32c.

Figure 4:
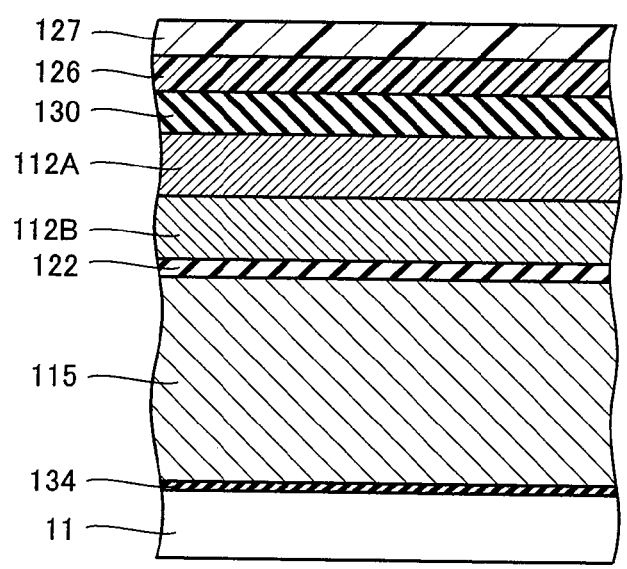
FIGS. 4 to 8 are cross-sectional views respectively indicating first to fifth steps for manufacturing the nonvolatile semiconductor device.

FIGS. 4 to 8 respectively indicate steps for manufacturing nonvolatile semiconductor device 10 constructed as above. FIG. 4 is a cross-sectional view of a first step for manufacturing nonvolatile semiconductor device 10. As shown in FIG. 4, an insulation film 134 is formed on the main surface of semiconductor substrate 11. Insulation film 134 functions as a tunnel insulation film of the floating gate formed, and is made of for example, silicon oxynitride (SiON).

Then, a conductor film 115 formed with, for example, polycrystalline silicon having a low resistance is deposited on a top surface of insulation film 134 by a method such as CVD (Chemical Vapor Deposition). Then, an insulation film formed with silicon oxide, an insulation film formed with silicon nitride and an insulation film formed with silicon oxide are successively deposited on a surface of conductor film 115 by a method such as CVD to form an ONO film 122. Thereafter, a conductor film 112B formed with polycrystalline silicon having a low resistance and a conductor film 112A having a resistance lower than that of conductor film 112B, which is a metal silicide film having a high melting point such as a tungsten silicide film, are respectively deposited from a lower side by a method such as CVD.

An insulation film 130 formed with silicon oxide, for example, is deposited by a method such as CVD using a TEOS gas, and a hard mask film 126 formed with polycrystalline silicon having a low resistance, for example, is then deposited thereon by a method such as CVD, and an antireflection film 127 formed with silicon oxynitride, for example, is further deposited thereon by a method such as CVD.

Then, a resist pattern for forming a control gate is formed on antireflection film 127, antireflection film 127 and hard mask film 126 are patterned using the resist pattern as an etching mask, and a resist pattern for forming a word line is then removed. A stacked film formed with remaining hard mask film 126 and antireflection film 127 is then used as an etching mask to etch insulation film 130, a high-melting-point metal silicide film 112A and conductor film 112B exposed therefrom.

Figure 5:
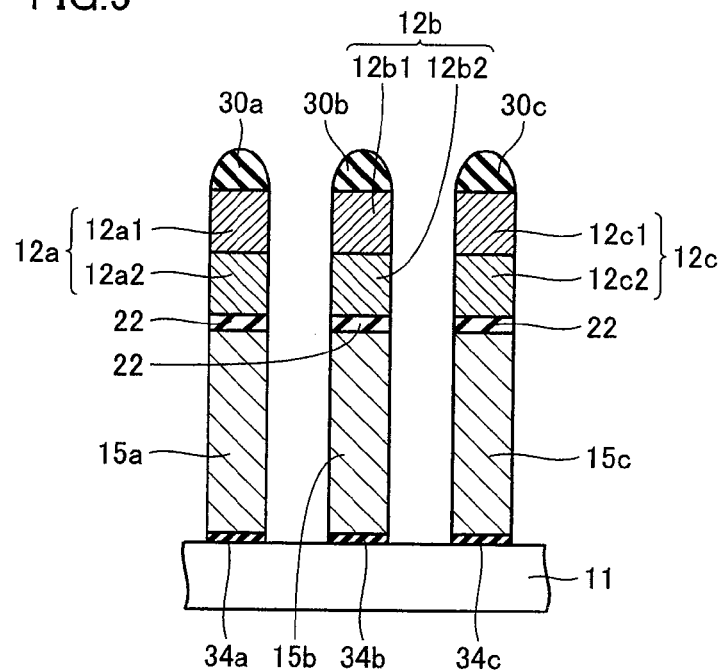
Figure 6:
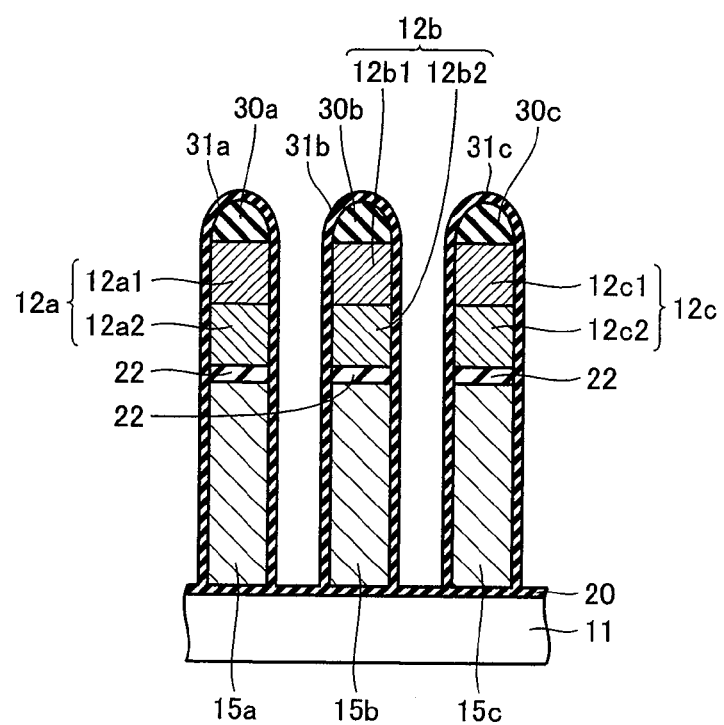

FIG. 5 is a cross-sectional view of a second step for manufacturing nonvolatile semiconductor device 10. As shown in FIG. 5, control gates 12a-12c formed are used as a mask to etch ONO film 122, conductor film 115 and insulation film 134 shown in FIG. 4. Floating gates 15a, 15c are formed as shown in FIG. 5. FIG. 6 is a cross-sectional view of a third step for manufacturing nonvolatile semiconductor device 10. As shown in FIG. 6, insulation films 31a-31c are formed on either side surfaces of floating gates 15a-15c, either side surfaces of control gates 12a-12c, and surfaces of cap insulation films 30a-30c by a method such as CVD. Each of insulation films 31a-31c is formed with a silicon oxide film or a silicon nitride film. In this step, an insulation film is formed on a portion of the main surface of semiconductor substrate 11 which is exposed to the outside among floating gates 15a-15c, which insulation film is linked with insulation films 34a-34c shown in FIG. 5 to form insulation film 20 on a whole main surface of semiconductor substrate 11.

Figure 7:
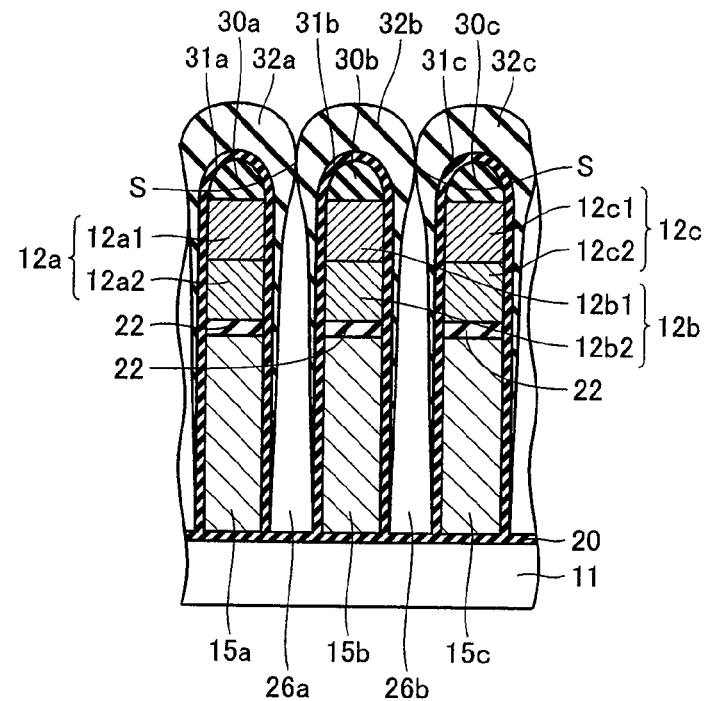

FIG. 7 is a cross-sectional view of a fourth step for manufacturing nonvolatile semiconductor device 10. As shown in FIG. 7, insulation films 32a-32c are formed via cap insulation films 30a-30c and insulation films 31a-31c in the fourth step. To form insulation films 32a-32c, an amount of flow of a film formation gas of a plasma CVD apparatus, which is not shown, is increased. When a supply amount of gas is made excessive, an amount of deportation is increased and an embedding property is decreased. As an example, it is preferable to set a supply amount of an $N_2O$ gas to at least 500 sccm and at most 600 sccm, and a supply amount of an $SiH_4$ gas to at least about 3 sccm and at most about 5 sccm.

It is especially preferable to increase an $N_2O/SiH_4$ ratio during formation of insulation films 32a-32c. Coverage can be decreased and the embedding property can be decreased by increasing the $N_2O/SiH_4$ ratio. The $N_2O/SiH_4$ ratio is preferably within a range of, for example, 1-2.

Furthermore, a film formation temperature is set to be lower than usual during formation of insulation films 32a-32c. When the film formation temperature is set to a low temperature, a surface reaction is delayed, which can decrease coverage and can decrease the embedding property. The film formation temperature is preferably within a range of, for example, at least 200° C. and at most 250° C.

In addition, power of a plasma source is set to a low value during formation of insulation films 32a-32c. When the power is set to a low value, a plasma density is decreased, radicals are decreased, coverage is decreased, and the embedding property is decreased. Power of the plasma source is preferably within a range of, for example, about 125-925 W.

In addition, a film formation pressure is set to be lower than usual during formation of insulation films 32a-32c. When the film formation pressure is made lower, directivity of film formation is enhanced and formation of the insulation film on side surfaces of control gates 12a-12c and side surfaces of floating gates 15a-15c is suppressed. The film formation pressure is preferably within a range of for example, at least $10^{-2}$ Torr and at most 9 Torr.

As described above, the embedding property of insulation films 32a, 32c is decreased by adjusting the amount of flow of the film formation gas, the $N_2O/SiH_4$ ratio, the film formation temperature, the power during film formation, and the film formation pressure. In addition, since aspect ratios between control gates 12a-12c and between floating gates 15a-15c are set to high values of about 3.5-5.0, insulation films 32a-32c do not easily enter space between control gates 12a-12c and between floating gates 15a-15c. Therefore, insulation films 32a-32c are formed on a side of upper end portions of control gates 12a-12c.

Insulation films 32a-32c are respectively stacked on the upper end portions of control gates 12a-12c and, at the same time, expand in a lateral direction. Furthermore, each of insulation films 32a-32c grows to contact another insulation film 32a-32c formed on the upper end portion of adjacent control gate 12a-12c to close an opening between control gates 12a-12c. In this step, since insulation films 32a-32c close openings of control gates 12a-12c after respectively stacked on the upper end portions of control gates 12a-12c, contact portion S of insulation films 32a-32c is located above the upper end portions of control gates 12a-12c. In addition, since cap insulation films 30a-30c are formed on the upper end portions of control gates 12a-12c, contact portion S of insulation films 32a-32c is reliably located above the upper end portions of control gates 12a-12c.

Therefore, gap portions 26a, 26b formed below contact portion S of insulation films 32a-32c are formed to extend from the main surface of semiconductor substrate 11 to a portion above the upper end portions of control gates 12a-12c. In addition, since the embedding property of insulation films 32a-32c is set to be low, insulation films 32a-32c are not readily formed on side surfaces of control gates 12a-12c and side surfaces of floating gates 15a-15c, and widths of gap portions 26a, 26b are ensured from upper end portions to lower end portions thereof. In particular, since floating gates 15a-15c are formed on a side of lower surfaces of control gates 12a-12c, insulation films 32a-32c are not readily formed on the side surfaces of floating gates 15a-15c.

Since the insulation films are formed on surfaces of control gates 12a-12c and floating gates 15a-15c, plasma damage to control gates 12a-12c and floating gates 15a-15c or the like during formation of insulation films 32a, 32c is alleviated. In addition, though cap insulation films 30a-30c remain on the upper end portions of control gates 12a-12c when insulation films 32a-32c are formed in the first embodiment, cap insulation films 30a-30c may be removed. When cap insulation films 30a-30c are removed, shapes of insulation films 32a-32c formed can be readily controlled. Therefore, insulation films 32a-32c can be formed to reliably expand in the lateral direction gradually from the upper end portions of control gates 12a-12c to an upper side.

Figure 8:
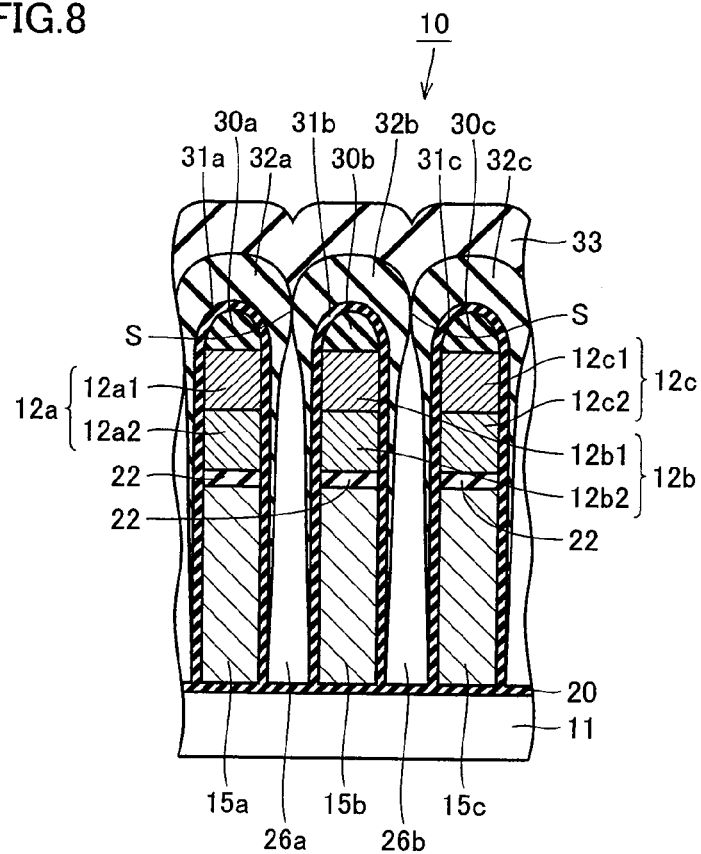

FIG. 8 is a cross-sectional view of a fifth step for manufacturing nonvolatile semiconductor device 10. As shown in FIG. 8, an insulation film 33 formed with silicon oxide or the like is formed on surfaces of insulation films 32a-32c to cover contact portion S between insulation films 32a-32c. Since insulation film 33 covers contact portion S between insulation films 32a-32c as such, entering of water into gap portions 26a, 26b is prevented during a subsequent CMP (Chemical Mechanical Polishing) step.

Figure 9:
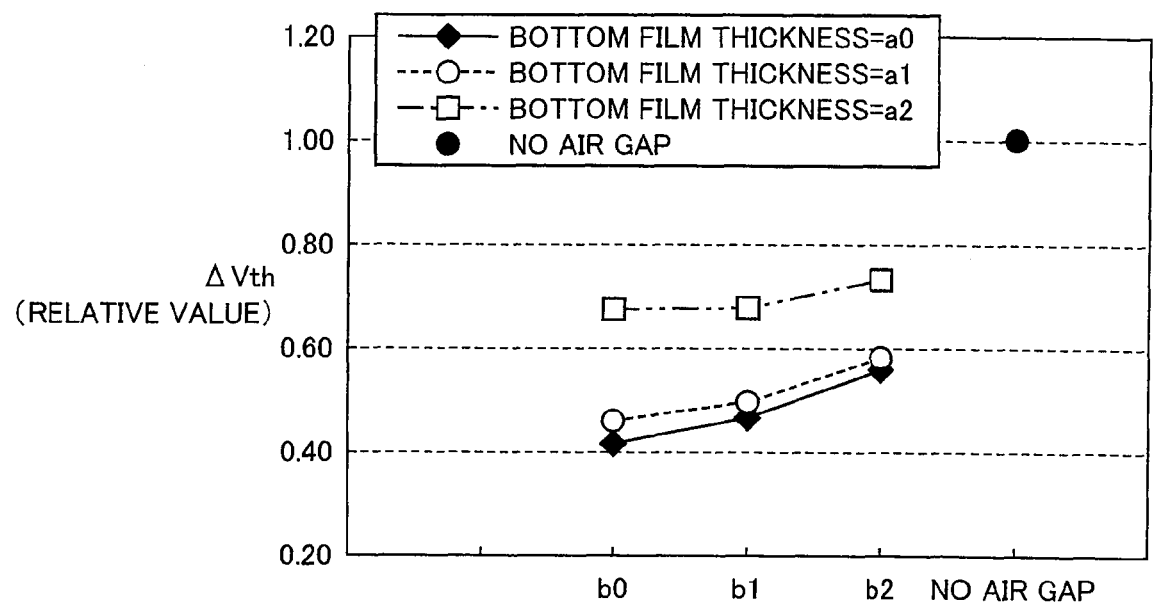
FIG. 9 is a graph indicating a relationship between a variation amount (relative ratio) $\Delta V_{th}$ of a potential of a floating gate and a thickness of an insulation film.

FIG. 9 is a graph indicating a relationship between a variation amount (relative ratio) ΔVth of a potential of a floating gate and a thickness of an insulation film. Each of bottom film thicknesses a0, a1, a2 in FIG. 9 means a thickness of the insulation film shown in FIG. 8 which is formed on the portion of the main surface of semiconductor substrate 11 exposed to the outside among floating gates 15a-15c. A relation "a0=0 nm<a1<a2<<no air gap" is satisfied. In addition, each of sidewall film thicknesses b0, b1, b2 means a thickness of the insulation film formed on side surface portions of floating gates 15a-15c. A relation "b0=0 nm<b1<b2<<no air gap" is satisfied. The "air gap" means gap portions 25a-27a, 25b-27b, 25c-27c shown in FIG. 1, and "no air gap" means that space between floating gates and between control gates is filled with the insulation film.

In FIG. 1, assuming that a potential of a floating gate α, any of floating gates 14a-14c, 15a-15c, 16a-16c adjacent to floating gate 15b, varies from VH to VL, variation amount (relative ratio) ΔVth of the potential of floating gate 15b is expressed with the following formula.

$$\Delta Vth = \sum \alpha \approx \sum_{\alpha=1}^{m} (Cfg15b - fg\alpha)/Cfgtotal \times (Vh\alpha - Vl\alpha)$$

(Herein, (Cfg15b–fgα) indicates a capacity between floating gate 15b and adjacent floating gate α, m indicates a number of floating gates having potentials varied, and Cfgtotal indicates a total capacity formed between floating gate 15b and adjacent floating gates.)

As shown in FIG. 9, ΔVth increases as the bottom film thickness increases and as the sidewall film thickness increases. It is also shown that ΔVth becomes large when gap portions 26a, 26b shown in FIG. 8 are not formed. That is, it is apparent that capacitive coupling between floating gates 14a-14c, 15a-15c, 16a-16c can be reduced as the thicknesses of the insulation films formed on bottom surfaces and side surfaces of gap portions 25a-27a, 25b-27b, 25c-27c in FIG. 1 are decreased.

In the steps for manufacturing nonvolatile semiconductor device 10 according to the first embodiment, since the film formation pressure is decreased to enhance directivity of film formation when insulation films 32a-32c are formed, insulation films are not readily formed on side surfaces of gap portions 25a-27a, 25b-27b, 25c-27c. Furthermore, since the amount of flow of the film formation gas, the $N_2O/SiH_4$ ratio, the film formation temperature, and the power during film formation in the step of forming insulation films 32a-32c are set within the ranges as described above to set a low embedding property, the insulation film does not reach the main surface of semiconductor substrate 11 and insulation films are not readily formed on bottom surfaces of gap portions 25a-27a, 25b-27b, 25c-27c. Therefore, it is apparent that variation amount (relative ratio) ΔVth of a potential of each of floating gates 14a-14c, 15a-15c, 16a-16c is reduced in nonvolatile semiconductor device 10 according to the first embodiment.

In nonvolatile semiconductor device 10 according to the first embodiment, since gap portions 26a, 26b are formed to extend from portions between floating gates 15a-15c to portions above upper end portions of control gates 12a-12c as shown in FIG. 3, a capacity formed between adjacent control gates 12a-12c is reduced. In addition, a capacity formed between, for example, floating gate 15b and control gates 12a, 12c on top surfaces of floating gates 15a, 15c adjacent to floating gate 15b is reduced with gap portions 26a, 26b. In particular, since upper end portions of gap portions 26a, 26b are located above upper end portions of control gates 12a, 12c, thicknesses of the insulation films formed on side surfaces of control gates 12a, 12c can be decreased. Therefore, a capacity between control gates 12a, 12c and the capacity formed between floating gate 15b and control gates 12a, 12c on top surfaces of floating gates 15a, 15c adjacent to floating gate 15b are reliably reduced.

As described above, according to nonvolatile semiconductor device 10 according to the first embodiment, since capacitive coupling formed between floating gates 14a-14c, 15a-15c, 16a-16c shown in FIG. 1 can be suppressed, a variation in a threshold voltage of floating gate 14a-14c, 15a-15c, 16a-16c can be suppressed when a potential of adjacent floating gate 14a-14c, 15a-15c, 16a-16c varies, and accurate reading can be performed. Furthermore, since a capacity between floating gate 14a-16c and control gate 12a-12c formed on floating gate 14a-16c adjacent to that floating gate 14a-16c can be reduced, more accurate reading can be performed. In particular, since a portion of insulation films 32a-32c on side surfaces of floating gates 15a-15c has a small thickness, a capacity between floating gates 15a-15c can be reliably decreased.

That is, since upper end portions of gap portions 26a, 26b are located above upper end portions of control gates 12a-12c, thicknesses of insulation films 32a-32c formed on side surfaces of control gates 12a-12c and side surfaces of floating gates 15a-15c can be decreased, and capacities formed between floating gates 15a-15c and control gates 12a-12c can be reduced.

In addition, a capacity between adjacent control gates 12a-12c can also be reduced, and an operation speed can be reliably increased. In particular, since a portion of insulation films 32a-32c on side surfaces of control gates 12a-12c has a small thickness and gap portions 26a, 26b are formed to extend to the portion above upper end portions of control gates 12a-12c, a capacity generated between control gates 12a-12c can be decreased.

Furthermore, according to a method of manufacturing nonvolatile semiconductor device 10 as described above, insulation films 32a-32c can be reliably formed on upper end portions of control gates 12a-12c by setting of the $N_2O/SiH_4$ ratio to 1-2, the film formation temperature within the range of at least 200° C. and at most 250° C., the power of the plasma source within the range of about 125-925 W, and the film formation pressure within the range of at least $10^{-2}$ Torr and at most 9 Ton in the step of forming insulation films 32a-32c. That is, by setting conditions for film formation to the ranges described above, the embedding property of insulation films 32a-32c can be decreased and insulation films 32a-32c can be formed only on the side of upper end portions of control gates 12a-12c.

In addition, since the insulation films are formed on surfaces of control gates 12a-12c before the step of forming insulation films 32a-32c, plasma damage to control gates 12a-12c and floating gates 15a-15c or the like during formation of insulation films 32a-32c can be alleviated. Furthermore, since insulation film 33 is formed after the step of forming insulation films 32a-32c, entering of water into gap portions 26a, 26b can be suppressed during a subsequent step of CMP or the like.

Second Embodiment

Figure 10:
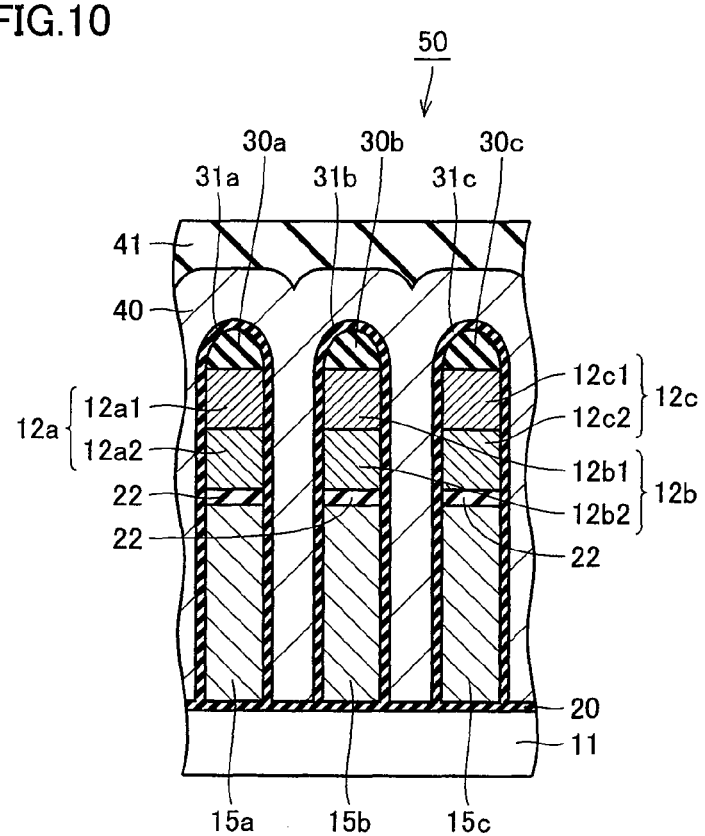
FIG. 10 is a cross-sectional view of a nonvolatile semiconductor device according to a second embodiment.

A nonvolatile semiconductor device 50 according to a second embodiment will now be described using FIGS. 10-17. FIG. 10 is a cross-sectional view of nonvolatile semiconductor device 50 according to the second embodiment. As shown in FIG. 10, nonvolatile semiconductor device 50 includes insulation film 20 formed on the main surface of semiconductor substrate 11, floating gates 15a-15c formed on the main surface via insulation film 20, ONO film 22 formed on top surfaces of floating gates 15a-15c, and control gates 12a-12c respectively formed on floating gates 15a-15c via ONO film 22.

Nonvolatile semiconductor device 50 also includes an insulation film 40 formed between control gates 12a-12c and between floating gates 15a-15c. Insulation film 40 is a porous insulation film having a permittivity lower than that of a silicon oxide film. A porous film having a permittivity of about 2.6, more specifically, silsesquioxane, porous silica, an aerogel thin film, HSG-255 (an organic SOG (Spin On Glass) material having high strength and a low permittivity), or the like is used as insulation film 40. Insulation film 40 formed with such a porous film or the like has a plurality of holes formed therein. Therefore, insulation film 40 has a large surface area and has hygroscopicity or a property of absorbing hydrogen.

An insulation film 41 is formed on a surface of insulation film 40. In contrast to insulation film 40, insulation film 41 is formed with a moisture-resistant insulating material.

Figure 11:
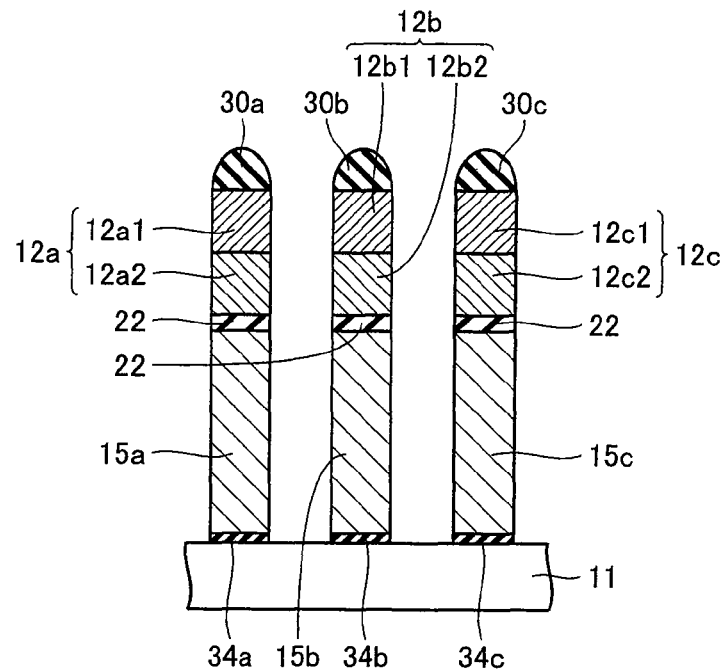
FIGS. 11 to 13 are cross-sectional views respectively indicating first to third steps for manufacturing the nonvolatile semiconductor device.
Figure 12:
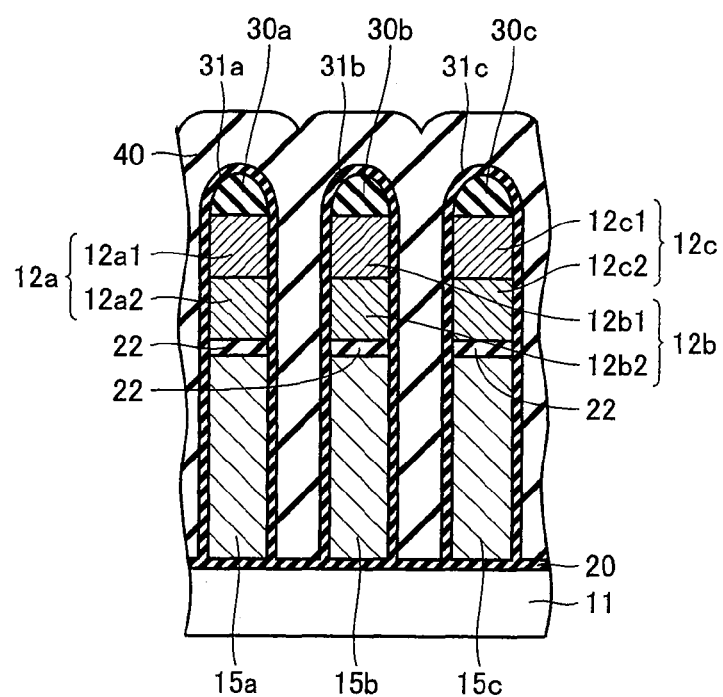
Figure 13:
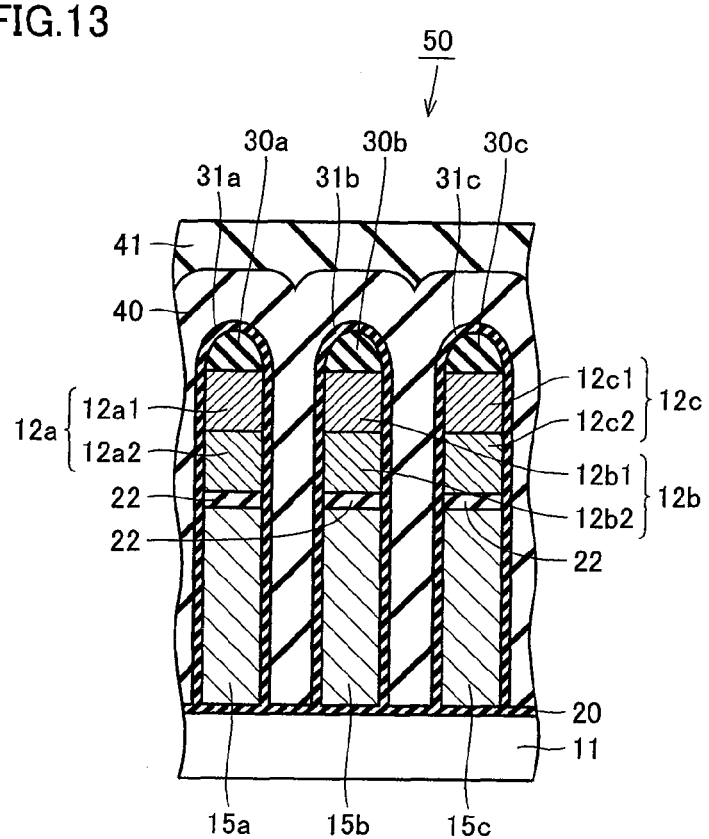

A method of manufacturing nonvolatile semiconductor device 50 is described using FIGS. 11 to 13. FIG. 11 is a cross-sectional view of a first step for manufacturing nonvolatile semiconductor device 50. As shown in FIG. 11, insulation films 34a-34c are formed spaced apart from each other on the main surface of semiconductor substrate 11, floating gates 15a-15c are formed on respective top surfaces of insulation films 34a-34c, ONO film 22 is formed on top surfaces of floating gates 15a-15c, and control gates 12a-12c are formed on a top surface of ONO film 22. Cap insulation films 30a-30c, which functioned as masks of control gates 12a-12c, remain on top surfaces of control gates 12a-12c.

FIG. 12 is a cross-sectional view of a second step for manufacturing nonvolatile semiconductor device 50. As shown in FIG. 12, insulation films 31a-31c are formed to cover side surfaces of floating gates 15a-15c, side surfaces of control gates 12a-12c and surfaces of cap insulation films 30a-30c. Then, insulation film 40 is formed to fill space between floating gates 15a-15c and between control gates 12a-12c.

FIG. 13 is a cross-sectional view of a third step for manufacturing nonvolatile semiconductor device 50. As shown in FIG. 13, insulation film 41 is formed on a top surface of insulation film 40.

In nonvolatile semiconductor device 50 formed as described above, since insulation film 40 which is a low-permittivity film fills space between floating gates 15a-15c in FIG. 10, a capacity formed between floating gates 15a-15c can be reduced. With this, a variation in a threshold voltage of each of floating gates 15a-15c can be suppressed.

In addition, since insulation film 40 also fills space between control gates 12a-12c, a capacity formed between control gates 12a-12c can be reduced. With this, an operation speed can be increased. In addition, since insulation film 40 also fills a portion above upper end portions of control gates 12a-12c, capacities formed between floating gates 15a-15c and control gates 12a-12c can be reliably reduced.

Since insulation film 40 adsorbs water or hydrogen, exuding of water or hydrogen to insulation film 20 can be prevented. Therefore, writing, reading and erasing operations can be performed accurately. Furthermore, since moisture-resistant insulation film 41 is formed on the top surface of insulation film 40, entering of water into insulation film 40 can be avoided during a subsequent CMP (Chemical Mechanical Polishing) step. With this, hygroscopicity or a hydrogen-adsorbing function of insulation film 40 can be ensured. It is to be noted that, though an example of the present invention applied to an AG (Assist Gate)-AND-type flash memory is described in each of the first and second embodiments above, the present invention is not limited thereto.

Figure 14:
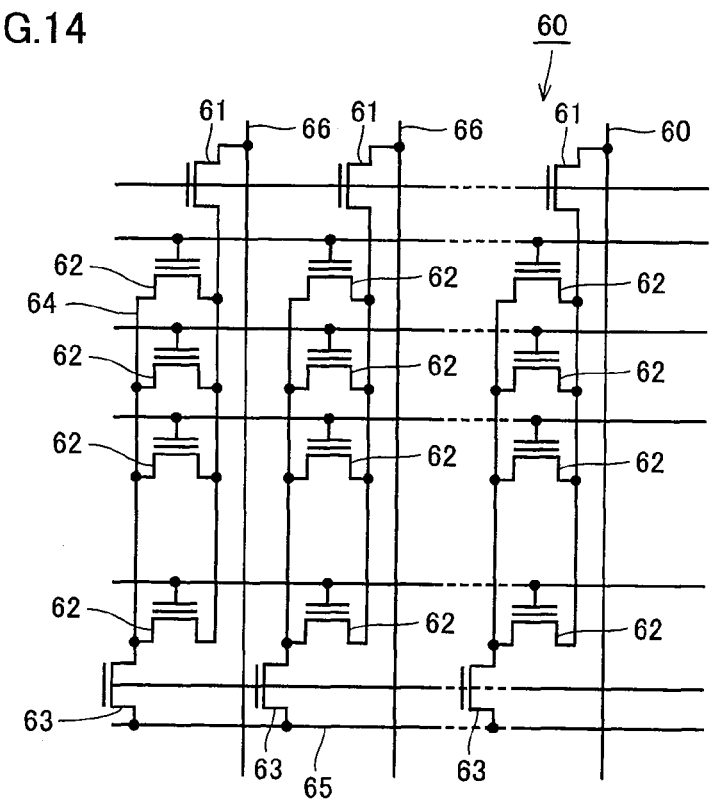
FIG. 14 is a circuit diagram of a general AND-type flash array structure.

FIG. 14 is a circuit diagram of a general AND-type flash array structure 60. As shown in FIG. 14, general AND-type flash array structure 60 includes a plurality of memory cell transistors 62 connected with a word line 64, a selection transistor 61 connected to a main bit line 66, and a selection transistor 63 connected to a source line.

Figure 15:
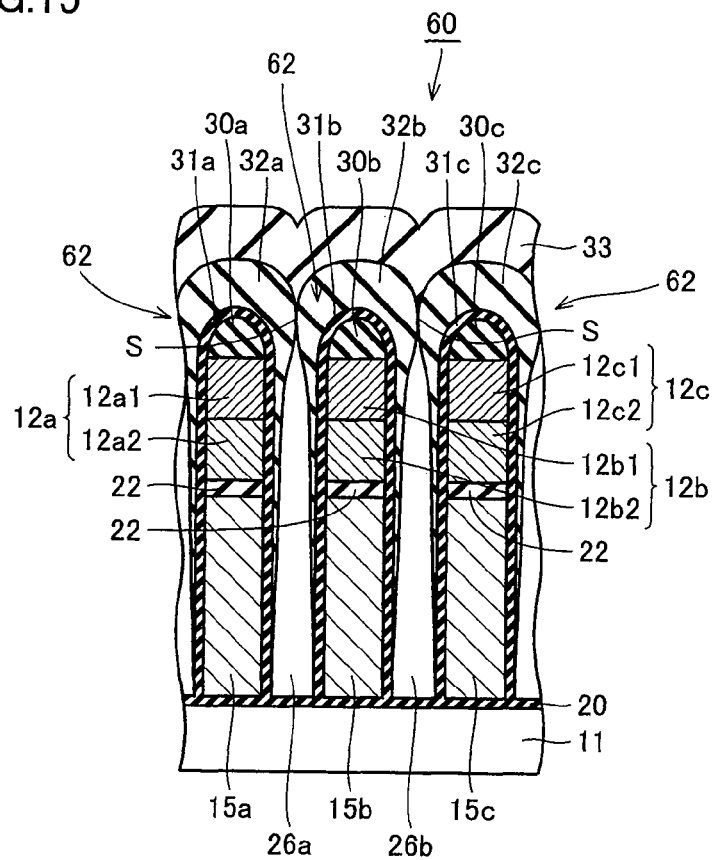
FIG. 15 is a cross-sectional view of a memory cell transistor.

FIG. 15 is a cross-sectional view of memory cell transistor 62. As shown in FIG. 15, memory cell transistor 62 includes gap portions 26a, 26b formed to extend from portions between floating gates 15a-15c to portions above upper end portions of control gates 12a-12c. Alternatively, a porous insulation film having a permittivity lower than that of a silicon oxide film may fill space extending from portions between floating gates 15a-15c to portions above upper end portions of control gates 12a-12c, as in the second embodiment. According to general AND-type flash array structure 60 formed as such, a capacity formed between floating gates 15a, 15c or the like can be reduced and a variation in a threshold voltage can be suppressed.

Figure 16:
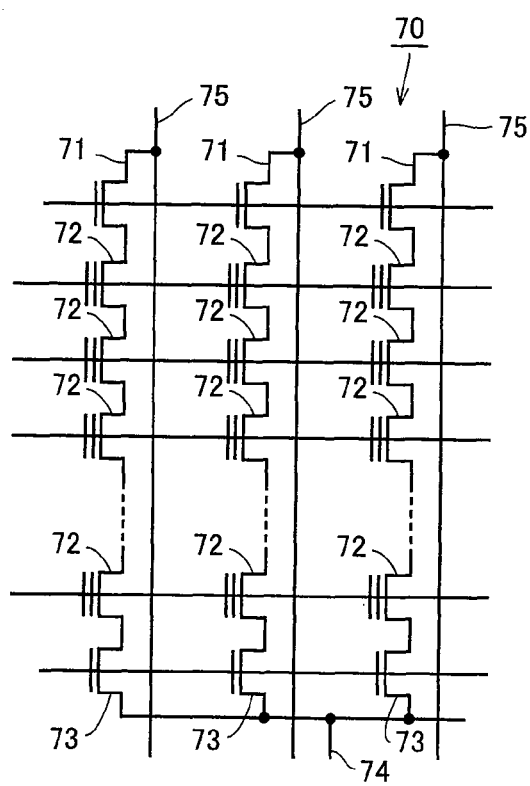
FIG. 16 is a circuit diagram of a general NAND-type flash array structure.
Figure 17:
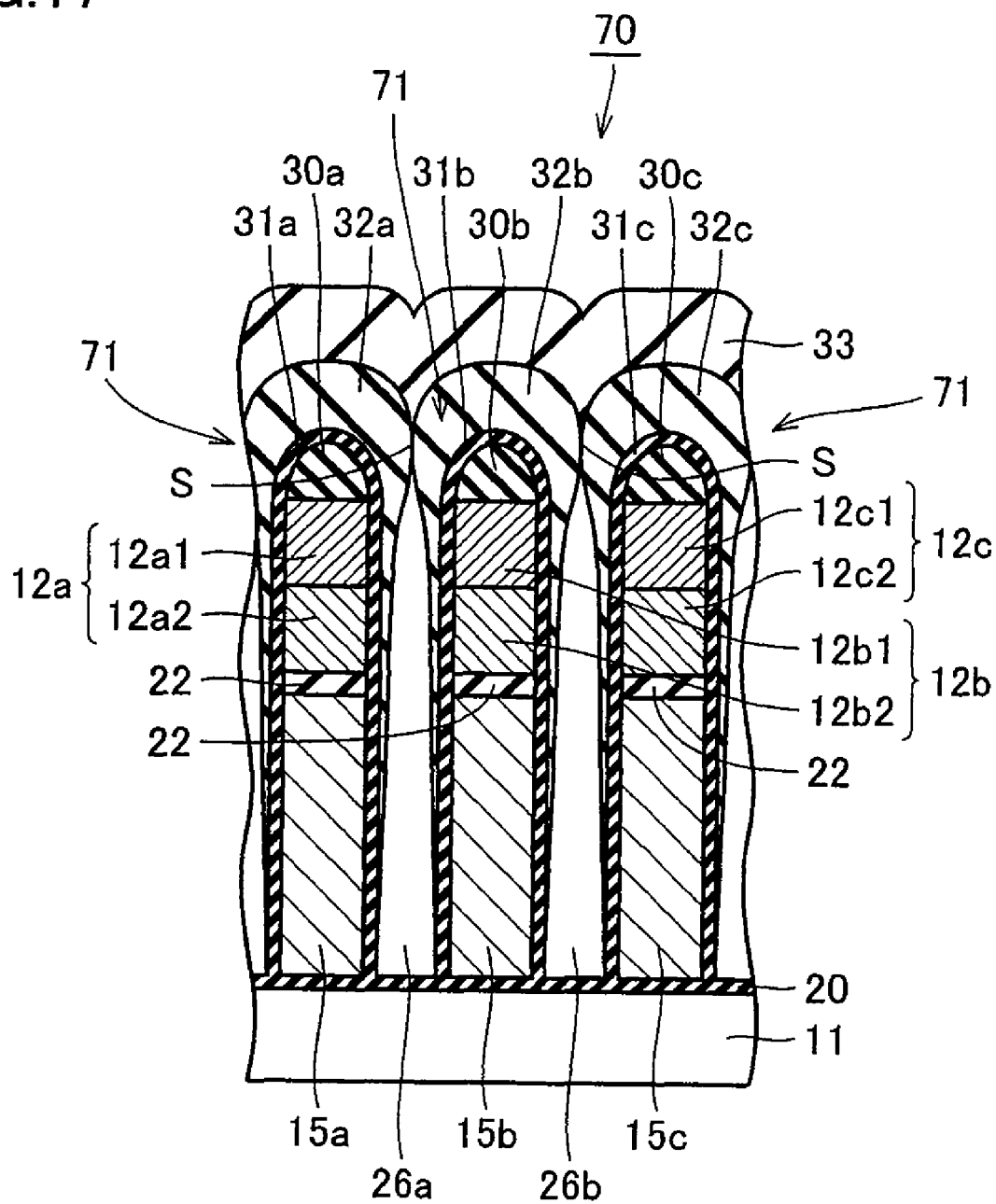
FIG. 17 is a detailed cross-sectional view of a memory cell transistor.

FIG. 16 is a circuit diagram of a general NAND-type flash array structure 70. As shown in FIG. 16, NAND-type flash array structure 70 includes a plurality of selection transistors 71 each connected to a bit line 75, selection transistors 73 connected to a source line, and a plurality of memory cell transistors 72 arranged between each selection transistor 71 and each selection transistor 73. FIG. 17 is a detailed cross-sectional view of memory cell transistor 72. As shown in FIG. 17, memory cell transistor 72 includes gap portions 26a-26b formed to extend from portions between floating gates 15a-15c to portions above upper end portions of control gates 12a-12c. Alternatively, a porous insulation film having a permittivity lower than that of a silicon oxide film may fill space extending from portions between floating gates 15a-15c to portions above upper end portions of control gates 12a-12c, as in the second embodiment. According to NAND-type flash array structure 70 constructed as such, a capacity formed between floating gates 15a, 15c can be reduced. In addition, effects similar to those of the nonvolatile semiconductor device according to each of the first and second embodiments can be obtained.

The present invention can be favorably applied to a nonvolatile semiconductor device and a method of manufacturing a nonvolatile semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a nonvolatile semiconductor device, comprising the steps of:

forming first and second floating gates on a main surface of a semiconductor substrate;

forming first and second control gates respectively on said first and second floating gates; and forming first and second insulation films on said first and second control gates, respectively, to expand in a lateral direction as the first and second insulation films expand upwardly from upper end portions of said first and second control gates;

forming a third insulation film on a surface of said first and second insulation films to cover a contact portion between said first insulation film and said second insulation film;

forming a gap portion between at least said first floating gate and said second floating gate by said first and second insulation films having an embedding property lower than the embedding property of said third insulation film; and said third insulation film being formed of a material different from the material of said first and second insulation films, and having moisture resistance capable of suppressing entry of water into said gap portion.

\* \* \* \* \*